United States Patent
Cao et al.

(10) Patent No.: US 9,455,324 B2
(45) Date of Patent: Sep. 27, 2016

(54) THIN FILM TRANSISTOR AND METHOD OF FABRICATING THE SAME, ARRAY SUBSTRATE AND METHOD OF FABRICATING THE SAME, AND DISPLAY DEVICE

(71) Applicant: BOE TECHNOLOGY GROUP CO., LTD., Beijing (CN)

(72) Inventors: Zhanfeng Cao, Beijing (CN); Qi Yao, Beijing (CN); Luke Ding, Beijing (CN); Bing Sun, Beijing (CN); Xiangchun Kong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/376,028

(22) PCT Filed: Nov. 27, 2013

(86) PCT No.: PCT/CN2013/087941
§ 371 (c)(1),
(2) Date: Jul. 31, 2014

(87) PCT Pub. No.: WO2015/027588
PCT Pub. Date: Mar. 5, 2015

(65) Prior Publication Data
US 2015/0340455 A1    Nov. 26, 2015

(30) Foreign Application Priority Data

Aug. 29, 2013 (CN) .......................... 2013 1 0385416

(51) Int. Cl.
*H01L 29/423* (2006.01)
*H01L 27/12* (2006.01)
(Continued)

(52) U.S. Cl.
CPC ....... *H01L 29/42364* (2013.01); *G02F 1/1368* (2013.01); *H01L 27/124* (2013.01);
(Continued)

(58) Field of Classification Search
CPC ............... H01L 29/42364; H01L 27/1214; H01L 27/1225; H01L 29/517; H01L 29/7869; H01L 27/1251
USPC ........ 257/53, 83, 88, 288, 367, 369; 438/85, 438/104, 116, 151, 197, 199
See application file for complete search history.

(56) References Cited

U.S. PATENT DOCUMENTS

| | | | | |
|---|---|---|---|---|
| 2006/0091392 A1* | 5/2006 | Lee | .................. | H01L 27/124 257/60 |
| 2009/0322657 A1* | 12/2009 | Na | .................. | H01L 27/3246 345/76 |
| 2011/0127520 A1* | 6/2011 | You | .................. | H01L 29/7869 257/43 |

(Continued)

FOREIGN PATENT DOCUMENTS

| CN | 1440224 A | 9/2003 |
|---|---|---|
| CN | 1766701 A | 5/2006 |

(Continued)

OTHER PUBLICATIONS

Search Report issued in International Application No. PCT/CN2013/087941, seventeen (17) pages.

(Continued)

*Primary Examiner* — Jarrett Stark
*Assistant Examiner* — Shahed Ahmed
(74) *Attorney, Agent, or Firm* — Nath, Goldberg & Meyer; Joshua B. Goldberg (57) ABSTRACT

The present invention provides a thin film transistor and a method of fabricating the thin film transistor, an array substrate and a method of fabricating the array substrate, and a display device. The thin film transistor includes a substrate and a gate, an insulation layer, an active layer, a source and a drain which are provided on the substrate. A spacer layer is also provided between the gate and the active layer, and the spacer layer overlaps at least with one of the gate and the active layer having a smaller area in an orthographic projection direction. The spacer layer can effectively prevent material forming the gate from being diffused into the active layer, thereby ensuring stability of performance of the thin film transistor. In the array substrate utilizing the thin film transistor, the spacer layer further extends to a region corresponding to a gate line.

18 Claims, 6 Drawing Sheets

(51) Int. Cl.
 H01L 29/51 (2006.01)
 G02F 1/1368 (2006.01)
 H01L 29/49 (2006.01)
 H01L 29/786 (2006.01)
(52) U.S. Cl.
 CPC ....... *H01L27/1225* (2013.01); *H01L 29/4908* (2013.01); *H01L 29/517* (2013.01); *H01L 29/7869* (2013.01); *H01L 29/78606* (2013.01); *H01L 2029/42388* (2013.01)

(56) References Cited

U.S. PATENT DOCUMENTS

| | | | |
|---|---|---|---|
| 2012/0052636 A1 | 3/2012 | Shin et al. | |
| 2012/0313092 A1* | 12/2012 | Shieh | H01L 21/428 257/43 |
| 2013/0271690 A1* | 10/2013 | Matsukizono | H01L 27/1225 349/46 |
| 2013/0335312 A1* | 12/2013 | Sasagawa | G02B 26/001 345/156 |

FOREIGN PATENT DOCUMENTS

| | | |
|---|---|---|
| CN | 101105615 A | 1/2008 |
| CN | 103456738 A | 12/2013 |
| JP | H11261075 | 9/1999 |

OTHER PUBLICATIONS

Chinese Patent Application No. 201310385416.5, Office Action dated Dec. 2, 2015, nine (9) pages, English translation, ten (10) pages.

Notification of the First Office Action dated Aug. 3, 2015 corresponding to Chinese application No. 201310385416.5.

Written Opinion of the International Searching Authority dated Jun. 4, 2014 corresponding to International application No. PCT/CN2013/087941.

* cited by examiner

THIN FILM TRANSISTOR AND METHOD OF FABRICATING THE SAME, ARRAY SUBSTRATE AND METHOD OF FABRICATING THE SAME, AND DISPLAY DEVICE

This is a National Phase Application filed under 35 U.S.C. 371 as a national stage of PCT/CN2013/087941, filed Nov. 27, 2013, and claims priority benefit from Chinese Application No. 201310385416.5, filed Aug. 29, 2013, the content of each of which is hereby incorporated by reference in its entirety.

FIELD OF THE INVENTION

The present invention relates to the field of display technology, and more particularly, to a thin film transistor and a method of fabricating the thin film transistor, an array substrate and a method of fabricating the array substrate, and a display device.

BACKGROUND OF THE INVENTION

Figure 11:
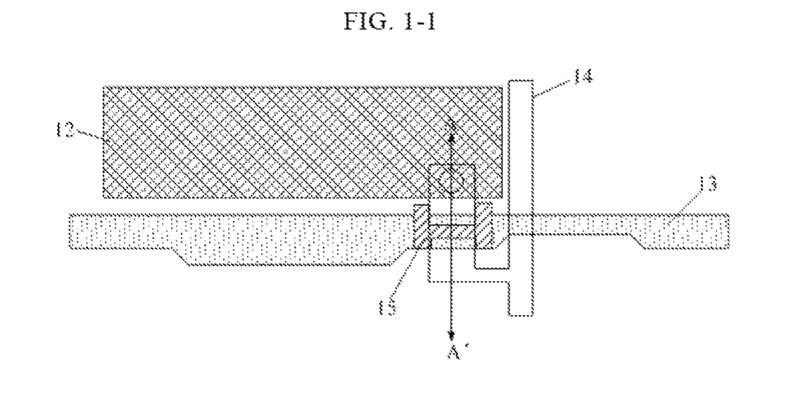
Figure 12:
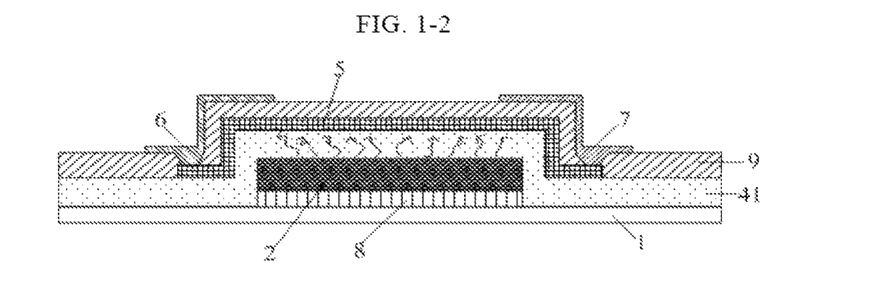

In a large-size OLED display device and a liquid crystal display device, a material with low resistance, for example, copper (Cu), is generally used for forming a gate and a gate line, and metal oxide is used for forming an active layer, so as to fabricate the display product with high resolution, high quality and high performance. FIG. 1-1 illustrates a plan view of a pixel structure in the prior art, in which a thin film transistor 15 is provided in a region surrounded by a gate line 13 and a data line 14 which intersect. FIG. 1-2 illustrates a cross-sectional view of the thin film transistor of a bottom-gate structure taken along a line AA' in FIG. 1-1, the thin film transistor includes a substrate 1, and a buffer layer 8, a gate 2, a gate insulation layer 41, an active layer 5, an etch stop layer 9, and a source 6 and a drain 7 provided in the same layer are sequentially formed on the substrate 1. The gate 2 that is made from copper is provided below the active layer 5, and the gate 2 is insulated from the active layer 5 by the gate insulation layer 41.

So far, forming the gate and the gate line by using copper and forming the active layer by using metal oxide is still an advanced technology in a fabrication process of the array substrate, but there exist some problems in the fabrication process. For example, in the thin film transistor shown in FIG. 1-2, the active layer 5 and the gate 2 are provided above and below the gate insulation layer 41, respectively. Since a capability of the gate insulation layer 41 preventing copper diffusion is relatively weak, and temperatures in subsequent processes of film layer depositing and annealing are relatively high, copper is likely to diffuse into the active layer 5, which affects a switching characteristic of the thin film transistor, so that the performance of the thin film transistor is unstable, and the switching characteristic of the thin film transistor may even be disabled.

SUMMARY OF THE INVENTION

For the above technical problem existing in prior art, the present invention provides a thin film transistor and a method of fabricating the thin film transistor, an array substrate and a method of fabricating the array substrate, and a display device. In the thin film transistor, material forming a gate may be effectively prevented from being diffused into an active layer by providing a spacer layer between the gate and the active layer, thereby ensuring stability of performance of the thin film transistor, further ensuring stability of performance of the array substrate.

The present invention provides a thin film transistor, including a substrate and a gate, an insulation layer, an active layer, a source and a drain which are provided on the substrate, the insulation layer being provided between the gate and the active layer, wherein a spacer layer is also provided between the gate and the active layer, and a blocking capability of the spacer layer with respect to diffusion of a material forming the gate is stronger than a blocking capability of the insulation layer with respect to the diffusion of the material forming the gate.

The spacer layer may overlap at least with one of the gate and the active layer having a smaller area in an orthographic projection direction.

The spacer layer may be closer to the gate than the insulation layer, and the insulation layer is provided between the spacer layer and the active layer. The source and the drain may be provided at two ends of the active layer, and partially overlap with the gate in the orthographic projection direction respectively.

The insulation layer may be a gate insulation layer, and the thin film transistor may further include an etch stop layer. The gate is provided on the substrate, the spacer layer, the gate insulation layer and the active layer are provided sequentially on the gate, the etch stop layer is provided on the active layer; via holes are provided in the etch stop layer corresponding to the two ends of the active layer, and the source and the drain are connected to the active layer through the via holes, respectively.

The insulation layer may be a passivation layer. The source and the drain are provided on the substrate to be separated from each other; the active layer is provided between the source and the drain and extends above the source and the drain, respectively, so as to contact a part of side walls and a part of upper surfaces of the source and the drain; the passivation layer and the spacer layer are sequentially provided on the active layer; and the gate is provided on the spacer layer.

The spacer layer may be made from metal or metal oxide having a characteristic of transition from electrical conductivity to electrical insulativity, the gate may be made from copper or aluminum, and the active layer may be made from metal oxide.

The spacer layer may be made from nano silver, indium tin oxide, indium-doped zinc oxide or indium gallium zinc oxide.

The present invention provides an array substrate, including the thin film transistor described above.

The array substrate may further include a gate line, the gate line is made from the same material as the gate, the gate line is connected to the gate and is provided in the same layer as the gate; the spacer layer further extends to a region corresponding to the gate line and overlaps at least with the gate line in the orthographic projection direction.

The present invention provides a display device, including the array substrate described above.

The present invention provides a method of fabricating a thin film transistor, including steps of forming a gate, an insulation layer, an active layer, a source and a drain on a substrate, the insulation layer is formed between the gate and the active layer. The method further includes a step of forming a spacer layer between the gate and the active layer, a blocking capability of the spacer layer with respect to diffusion of a material forming the gate is stronger than a blocking capability of the insulation layer with respect to the diffusion of the material forming the gate.

The spacer layer may overlap at least with one of the gate and the active layer having a smaller area in an orthographic projection direction.

The insulation layer may be formed between the spacer layer and the active layer.

In the step of forming the spacer layer between the gate and the active layer, electrical conductivity of the spacer layer in a region corresponding to the active layer or the gate is remained and electrical conductivity of the spacer layer in the other region is converted into electrical insulativity, by an ion implantation process or a plasma treatment process using a photoresist as a mask.

The spacer layer may be made from metal or metal oxide having a characteristic of transition from electrical conductivity to electrical insulativity, and the step of forming the spacer layer may include: depositing a material for forming the spacer layer to form a spacer layer film in an atmosphere of argon so that the spacer layer film has electrical conductivity; and performing an ion implantation process or a plasma treatment process on the spacer layer film to form a pattern comprising the spacer layer in an atmosphere of oxygen or nitrogen so that the spacer layer has electrical conductivity in the region corresponding to the active layer or the gate, and has electrical insulativity in regions other than the region corresponding to the active layer or the gate.

The spacer layer may be made from nano silver, indium tin oxide, indium-doped zinc oxide or indium gallium zinc oxide.

The present invention provides a method of fabricating an array substrate, including the method of fabricating the thin film transistor described above.

The method may further include steps of forming a gate line and the spacer layer corresponding to the gate line on the substrate, the gate line and the gate are formed in a single pattering process, the gate line is connected to the gate and is provided in the same layer as the gate, and the spacer layer overlaps at least with the gate line in the orthographic projection direction.

In the step of forming the spacer layer corresponding to the gate line, electrical conductivity of the spacer layer in a region corresponding to the gate line is further remained, and electrical conductivity of the spacer layer in regions other than the region corresponding to the active layer or the gate and the region corresponding to the gate line is converted into electrical insulativity.

Technical effects of the present invention are as follows. In the thin film transistor in the present invention, the material forming the gate, for example, copper ion or aluminum ion, may be effectively prevented from being diffused into the active layer, by providing the spacer layer between the gate and the active layer, thereby ensuring stability of performance of the thin film transistor. In the array substrate in the present invention, the spacer layer prevents the material forming the gate from being diffused into the active layer in the thin film transistor, and further prevents the material forming the gate line from being diffused into the active layer, thereby ensuring stability of performance of the array substrate.

BRIEF DESCRIPTION OF THE DRAWINGS

FIG. 1-1 is a plan view of a pixel structure in the prior art.

FIG. 1-2 is a cross-sectional view of a thin film transistor taken along a line AA' in FIG. 1-1.

FIGS. 3-1 through 3-7 are cross-sectional views of structures obtained at respective steps during fabrication of the thin film transistor in FIG. 2, in which FIG. 3-1 is a cross-sectional view of a structure obtained after forming a pattern comprising a gate;

FIG. 3-2 is a cross-sectional view of a structure obtained after forming a pattern comprising a spacer layer film, a gate insulation layer film and an active layer film;

FIG. 3-3 is a cross-sectional view of a structure obtained after forming a pattern comprising an active layer and a gate insulation layer;

FIG. 3-4 is a cross-sectional view illustrating how to form a pattern comprising a spacer layer;

FIG. 3-5 is a cross-sectional view of a structure obtained after the pattern comprising the spacer layer is formed;

FIG. 3-6 is a cross-sectional view of a structure obtained after a photoresist mask is stripped off;

FIG. 3-7 is a cross-sectional view of a structure obtained after forming a pattern comprising a source and a drain.

FIGS. 5-1 through 5-6 are cross-sectional views of structures obtained at respective steps during fabrication of the thin film transistor in FIG. 4, in which FIG. 5-1 is a cross-sectional view of a structure obtained after forming a pattern comprising a source and a drain;

FIG. 5-2 is a cross-sectional view of a structure obtained after forming a pattern comprising an active layer and a passivation layer and forming a pattern comprising a spacer layer film and a gate film;

FIG. 5-3 is a cross-sectional view of a structure obtained after forming a pattern comprising a gate;

FIG. 5-4 is a cross-sectional view illustrating how to form a pattern comprising a spacer layer;

FIG. 5-5 is a cross-sectional view of a structure obtained after the pattern comprising the spacer layer is formed;

FIG. 5-6 is a cross-sectional view of a structure obtained after a photoresist mask is stripped off.

DESCRIPTION OF THE PREFERRED EMBODIMENT

Hereinafter, for the person skilled in the art to better understand the technical solution of the present invention, a thin film transistor and a method of fabricating the thin film transistor, an array substrate and a method of fabricating the array substrate, and a display device will be described in detail with reference to the accompanying drawings and the exemplary embodiments.

First Embodiment

Figure 2:
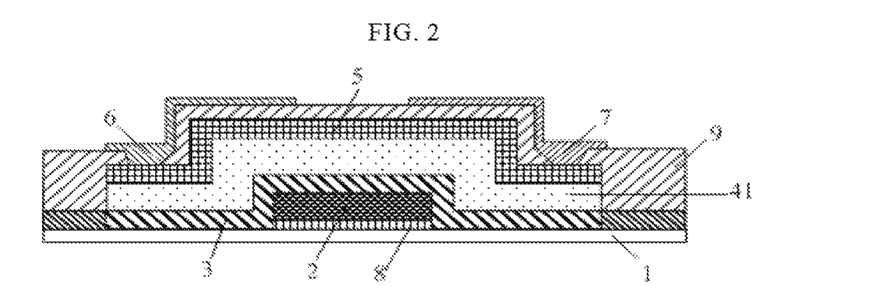
FIG. 2 is a cross-sectional view of a thin film transistor according to a first embodiment of the present invention.

This embodiment provides a thin film transistor, and the thin film transistor is of a bottom-gate structure. As shown in FIG. 2, the thin film transistor includes a substrate 1, and a gate 2, a gate insulation layer 41 serving as an insulation layer, an active layer 5, a source 6 and a drain 7 provided on the substrate 1. The gate insulation layer 41 is provided between the gate 2 and the active layer 5, and a spacer layer 3 is also provided between the gate 2 and active layer 5. The spacer layer 3 overlaps at least with one of the gate 2 and the active layer 5 having a smaller area in an orthographic projection direction, a blocking capability of the spacer layer 3 with respect to diffusion of a material forming the gate 2 is stronger than a blocking capability of the gate insulation layer 41 with respect to diffusion of the material forming the gate 2, so that the material forming the gate 2 is prevented from being diffused into the active layer 5.

In the embodiment, the thin film transistor may further include a buffer layer 8, the buffer layer 8 is provided directly below the gate 2 and overlaps with the gate 2 in the orthographic projection direction. The gate 2 is provided on the buffer layer 8, so that the gate 2 is more firmly attached and is not likely to fall off. The gate 2 is provided opposite to the active layer 5, the source 6 and the drain 7 are provided at two ends of the active layer 5, and the source 6 and the drain 7 partially overlap with the gate 2 in the orthographic projection direction, respectively. The gate insulation layer 41 is provided between the gate 2 and the active layer 5, the spacer layer 3 is closer to the gate 2 than the gate insulation layer 41, and the gate insulation layer 41 is provided between the spacer layer 3 and the active layer 5, which facilitates blocking diffusion of the material of the gate 2.

In the embodiment, the thin film transistor may further include an etch stop layer 9. Specifically, in the thin film transistor, the gate 2 is provided on the buffer layer 8; the spacer layer 3, the gate insulation layer 41 and the active layer 5 are sequentially provided on the gate 2; the active layer 5 is provided above the gate insulation layer 41 with respect to the gate 2; the etch stop layer 9 is provided on the active layer 5 and contacts the active layer 5 and the gate insulation layer 41; the source 6 and the drain 7 are provided above the etch stop layer 9 with respect to two ends of the active layer 5, and the source 6 and the drain 7 partially overlap with the gate 2 in the orthographic projection direction, respectively; via holes are provided in positions of the etch stop layer 9 corresponding to the two ends of the active layer 5, and the source 6 and the drain 7 are connected to the active layer 5 through the via holes, respectively. By providing the etch stop layer 9, etchant is prevented from affecting the active layer 5 located below the source 6 and the drain 7 when the source 6 and the drain 7 are formed by an etching process using the etchant.

The spacer layer 3 is made from metal (e.g., nano silver) or metal oxide (e.g., indium tin oxide (ITO), indium-doped zinc oxide (IZO), or indium gallium zinc oxide (IGZO)) having a characteristic of transition from electrical conductivity to electrical insulativity. The gate 2 is made from copper, aluminum, copper alloy or aluminum alloy. The active layer 5 is made from metal oxide such as indium gallium zinc oxide, indium zinc oxide, indium tin oxide or indium gallium tin oxide.

The embodiment also provides a method of fabricating a thin film transistor, including steps of forming a gate, a gate insulation layer, an active layer, a source and a drain on a substrate. The method further includes a step of forming a spacer layer between the gate and the active layer, the spacer layer overlaps at least with one of the gate and the active layer having a smaller area in an orthographic projection direction, a blocking capability of the spacer layer with respect to diffusion of a material forming the gate is stronger than a blocking capability of the gate insulation layer with respect to the diffusion of the material forming the gate, so that the material forming the gate is prevented from being diffused into the active layer.

Before the detailed description of the fabricating method, an explanation will be made on a patterning process. The patterning process may only include a photolithography process, or may include a photolithography process and an etching process, while may further include other processes for forming predetermined patterns such as printing, inkjet, etc. The photolithography process may refer to a process for forming a pattern by using photoresist, a mask plate, an exposure machine, etc., including steps of film forming, exposing, developing, etc. In the present invention, the corresponding patterning process may be selected according to the structure of the array substrate to be formed.

For the thin film transistor according to the embodiment of the present invention, in the step of forming the spacer layer between the gate and the active layer, electrical conductivity of the spacer layer in the region corresponding to the active layer or the gate is remained and electrical conductivity of the spacer layer in the other region is converted into the electrical insulativity, by an ion implantation process or a plasma treatment process using the photoresist as a mask.

Specifically, the method of fabricating the thin film transistor includes following steps.

Figure 31:
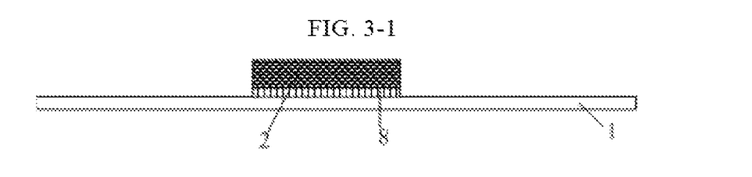

At step S1, a pattern comprising the gate 2 is formed on the substrate 1.

Before this step, that is, before the gate 2 is formed, the method may further include a step of forming a pattern comprising the buffer layer 8 on the substrate 1. The pattern comprising the buffer layer 8 is formed by the following steps: depositing a layer of metal film (e.g., molybdenum, titanium, molybdenum alloy or titanium alloy) and then performing an exposure, a development and an etching processes on the layer of metal film to form a pattern corresponding to the gate 2.

Next, as shown in FIG. 3-1, the pattern comprising the gate 2 is formed on the buffer layer 8. The buffer layer 8 overlaps with the gate 2 in the orthographic projection direction, and the gate 2 can be firmly attached to the buffer layer 8 and is not likely to fall off.

Figure 32:
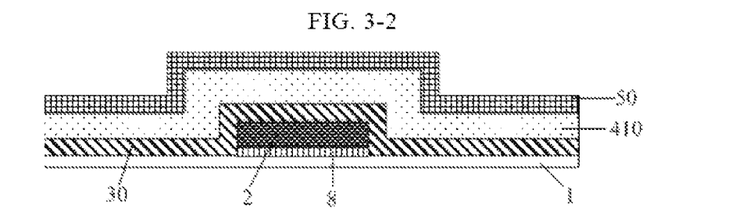

At step S2, as shown in FIG. 3-2, a spacer layer film 30, a gate insulation layer film 410 and an active layer film 50 are formed on the substrate 1 subjected to the step S1.

At this step, the spacer layer film 30 is made from metal or metal oxide having a characteristic of transition from electrical conductivity to electrical insulativity, the material for forming the spacer layer 3 is deposited to form the spacer layer film 30 in an atmosphere of argon, and the spacer layer film 30 has electrical conductivity. The gate 2 is made from copper. The active layer film 50 is made from metal oxide such as indium gallium zinc oxide, indium zinc oxide, indium tin oxide or indium gallium tin oxide.

Figure 33:
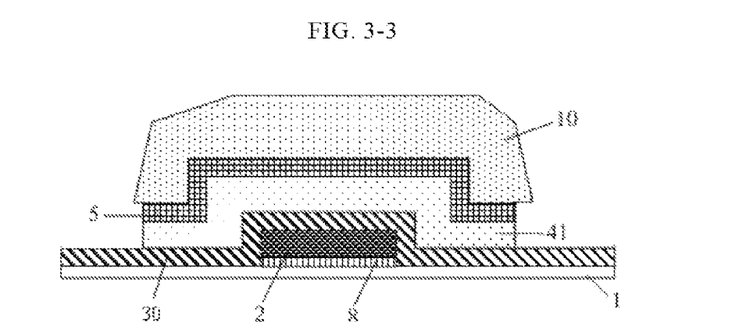
Figure 34:
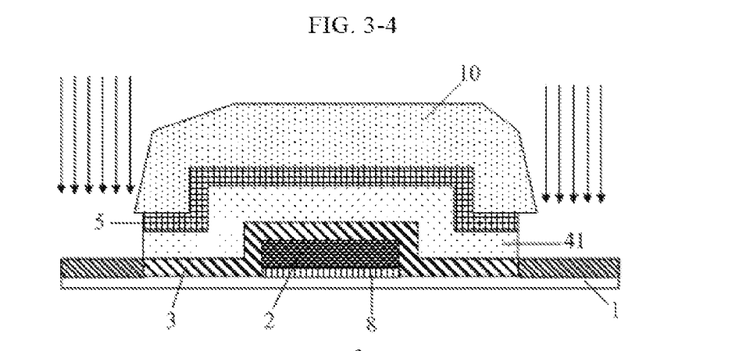

At step S3, as shown in FIG. 3-3, a pattern comprising the active layer 5 and the gate insulation layer 41 is formed, by a patterning process, on the substrate 1 subjected to the step S2. The active layer 5 is provided opposite to the gate 2. In addition, as shown in FIG. 3-4, a pattern comprising the spacer layer 3 is formed by an ion implantation process or a plasma treatment process.

Specifically, this step includes following steps.

At step S31, a photoresist is applied on the substrate 1 subjected to the step S2.

At step S32, a photoresist mask 10 is formed by using a mask plate provided with the pattern of the active layer 5 through an exposure process and a development process.

At step S33, the active layer film 50 is etched by a first etching process to form a pattern comprising the active layer 5, so that an area of the active layer 5 is larger than that of the gate 2.

At this step, the etching process is a wet etching process. In the wet etching process, sulfuric acid and nitric acid solution added with glacial acetic acid etc. may be used as etchant, and the etching process is performed under the condition of room temperature to 45 degrees.

At step S34, the gate insulation layer film 410 is etched by a second etching process to form a pattern comprising the gate insulation layer 41.

At this step, the etching process is a dry etching process. In the dry etching process, gas containing fluorine element, such as $SF_6$, $CF_4$, $CHF_3$, etc., or gas mixture of the above-mentioned gas (the gas containing fluorine element, such as $SF_6$, $CF_4$, $CHF_3$, etc.) and $O_2$ may be used as etchant, and the etching process is performed in a reactive ion etching machine, a plasma etching machine or an inductively coupled plasma etching machine.

Figure 35:
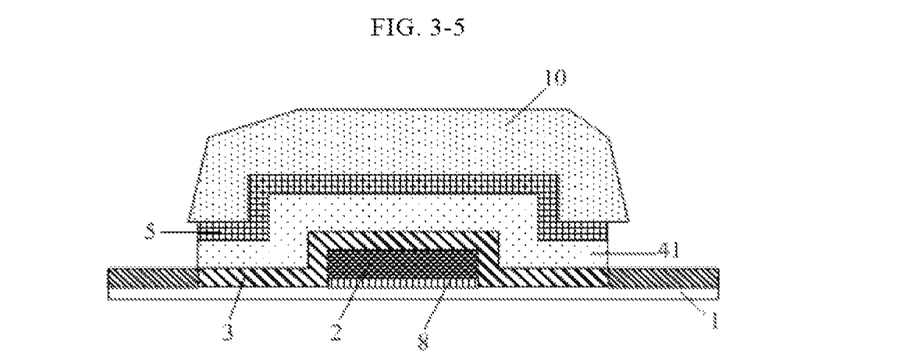

At step S35, as shown in FIG. 3-4, electrical conductivity of the spacer layer film 30 in the region corresponding to the active layer 5 is remained and electrical conductivity of the spacer layer film 30 in the other region is converted into electrical insulativity by an ion implantation process or a plasma treatment process, thereby forming the pattern comprising the spacer layer 3, as shown in FIG. 3-5.

At this step, the ion implantation process (e.g., an oxygen ion implantation process) or the plasma treatment process is performed on the spacer layer film 30 in the atmosphere of oxygen or nitrogen to form the pattern comprising the spacer layer 3. The spacer layer 3 has electrical conductivity at the region corresponding to the active layer 5, and has electrical insulativity at the other region. The spacer layer 3 subjected to such a processing can prevent the diffusion of copper ion or aluminum ion of the gate 2 well.

The spacer layer can prevent the copper ion or the aluminum ion of the gate 2 from being diffused into the active layer 5. The gate insulation layer 41 can prevent electrostatic breakdown well, and also can prevent the copper ion or the aluminum ion of the gate 2 from being diffused into the active layer 5 (but the capability of preventing the diffusion thereof is weaker than that of the spacer layer 3).

Figure 36:
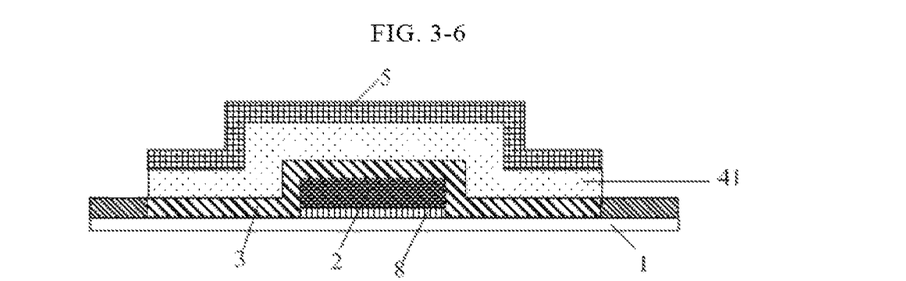

At step S36, as shown in FIG. 3-6, the photoresist mask 10 is removed by a lift-off process.

Figure 37:
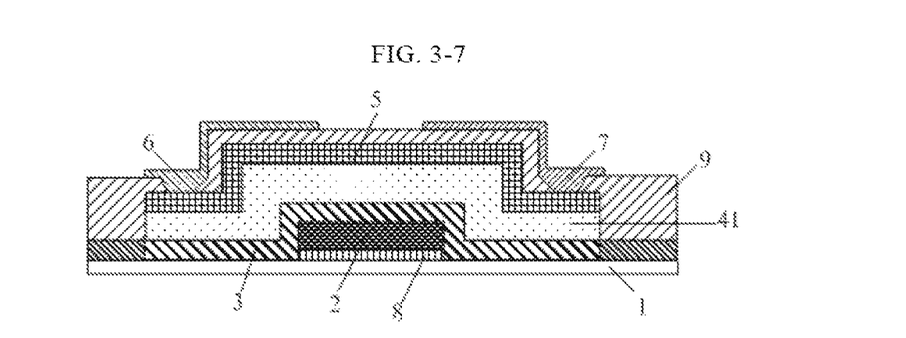

At step S4, as shown in FIG. 3-7, a pattern comprising the source 6 and the drain 7 is formed on the substrate 1 subjected to the step S3.

Before this step, a pattern comprising the etch stop layer 9 may be formed on the substrate 1 subjected to the step S3, and then the source 6 and the drain 7 are formed on the etch stop layer 9. That is, the etch stop layer 9 is formed above the active layer 5 and below the source 6 and the drain 7. Via holes are provided in the regions of the etch stop layer 9 corresponding to two ends of the active layer 5, respectively, and the source 6 and the drain 7 are connected to the active layer 5 through the via holes, respectively.

After above steps, fabrication of the thin film transistor of a bottom-gate structure is finished.

In the embodiment, there is illustrated an example in which the gate is located at bottom of the thin film transistor, the area of the gate is smaller than that of the active layer, and the spacer layer overlaps with the active layer in the orthographic projection direction. When the material forming the gate starts to be diffused, it may be forwardly diffused towards the region corresponding to the active layer. By the spacer layer and the insulation layer, the diffusion of the material forming the gate may be effectively prevented, for example, the copper ion or the aluminum ion is prevented from being diffused into the active layer, thereby ensuring stability of performance of the thin film transistor.

It should be appreciated that, when the area of the gate is larger than that of the active layer in the thin film transistor, in the fabricating method according to the embodiment, the spacer layer overlaps with the active layer in the orthographic projection direction. When the material forming the gate starts to be diffused, the copper ion or the aluminum ion in a portion of the gate corresponding to the active layer in the orthographic projection direction may be forwardly diffused towards the active layer, while the copper ion or the aluminum ion in portions of the gate extending beyond the portion corresponding to the active layer may be laterally diffused towards the active layer. Since the copper ion or the aluminum ion which is forwardly diffused dominates in all diffused copper ion or aluminum ion, the material forming the gate may be effectively prevented from being diffused into the active layer by the spacer layer and the insulation layer, thereby ensuring stability of performance of the thin film transistor.

In addition, in a thin film transistor of a bottom-gate structure, when an area of a gate is smaller than that of an active layer, a spacer layer may overlap with the gate in an orthographic projection direction. In this case, the method of fabricating the thin film transistor may include following steps: forming a pattern comprising the gate 2 on the substrate 1; forming a spacer layer film 30, and then forming the spacer layer 3 corresponding to the pattern of the gate by using a mask plate provided with the pattern of the gate 2 (the spacer layer is formed in the same manner as mentioned above); and forming a gate insulation layer film 410 and an active layer film 50, and then forming a pattern comprising the gate insulation layer 41 and the active layer 5 by a patterning process.

Second Embodiment

Figure 4:
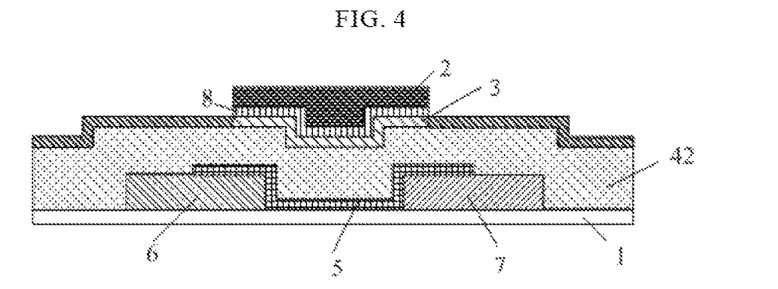
FIG. 4 is a cross-sectional view of a thin film transistor according to a second embodiment of the present invention.

This embodiment provides a thin film transistor, and the thin film transistor is of a top-gate structure. Different from the first embodiment, as shown in FIG. 4, an insulation layer of the thin film transistor is a passivation layer 42; a source 6 and a drain 7 are disposed on a substrate 1 to be separated from each other; the active layer 5 is provided between the source 6 and the drain 7 and extends above the source 6 and the drain 7, respectively, so as to contact a part of side walls and a part of upper surfaces of the source 6 and the drain 7; the passivation layer 42 and a spacer layer 3 are sequentially provided on the active layer 5; a buffer layer 8 is provided on the spacer layer 3; and a gate 2 is provided on the buffer layer 8.

It should be noted that, an etch stop layer may be provided between the active layer and the source/the drain in the thin film transistor of the top-gate structure in the embodiment, or the etch stop layer may not be provided. An example in which the etch stop layer is not provided will be described in the embodiment.

For the above thin film transistor according to the embodiment of the present invention, the embodiment also provides a method of fabricating the thin film transistor. Different from the method of fabricating the thin film transistor in the first embodiment, the method specifically includes following steps.

Figure 51:
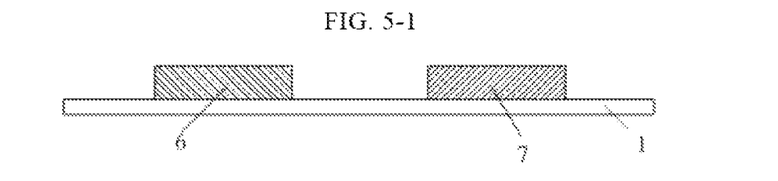

At step S1', as shown in FIG. 5-1, a pattern comprising the source 6 and the drain 7 is formed on the substrate 1.

Figure 52:
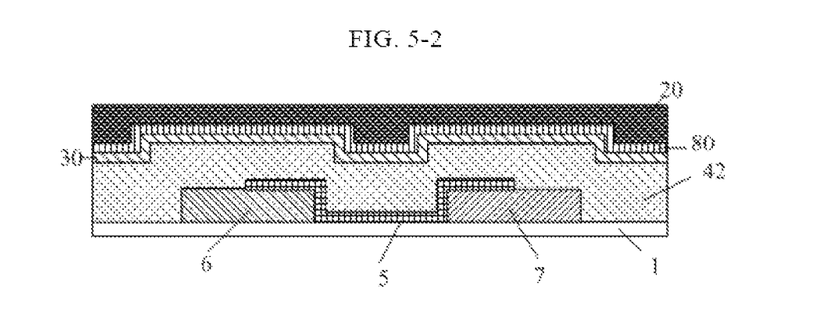

At step S2', as shown in FIG. 5-2, patterns comprising the active layer 5 and the passivation layer 42 are formed on the substrate 1 subjected to the step S1', and a spacer layer film 30 and a gate layer film 20 are formed on the passivation layer 42.

At this step, after the spacer layer film 30 is formed on the passivation layer 42, a buffer layer film 80 may be formed on the spacer layer film 30, for example, a layer of metal film is formed by depositing molybdenum, titanium, molybdenum alloy or titanium alloy; and then the gate film 20 is formed on the buffer layer film 80.

Figure 53:
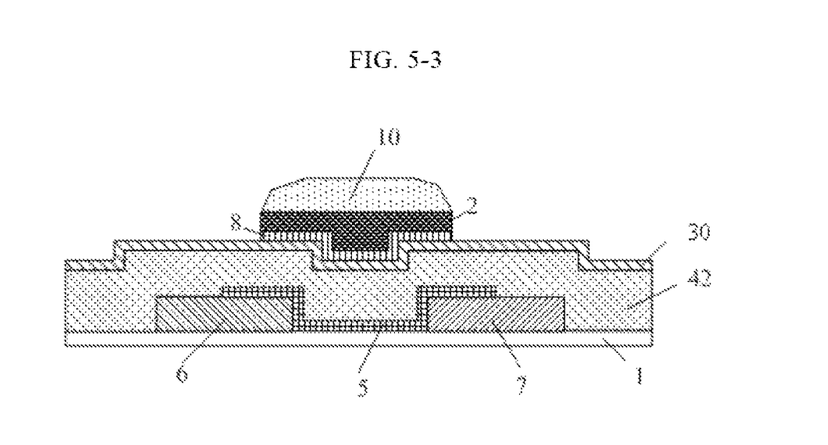
Figure 54:
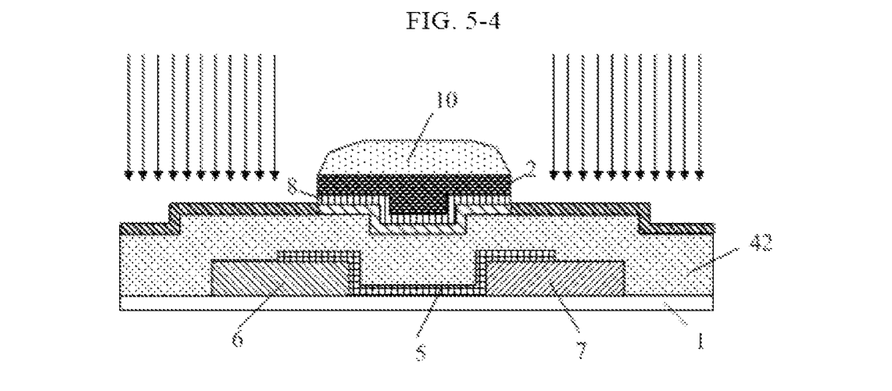
Figure 55:
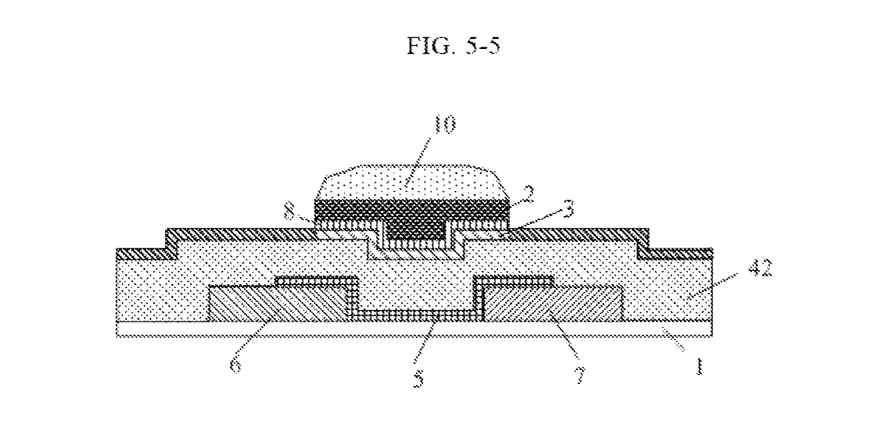

At step S3', as shown in FIG. 5-3, a pattern comprising the gate 2 is formed on the substrate 1 subjected to the step S2' by a patterning process. The active layer 5 is provided opposite to the gate 2. As shown in FIG. 5-4, a pattern comprising the spacer layer 3 shown in FIG. 5-5 is formed by an ion implantation process or a plasma treatment process.

At this step, after the pattern comprising the gate 2 is formed, a pattern comprising the buffer layer 8 is formed by an etching process. The shape of the buffer layer 8 corresponds to the shape of the gate 2, and the gate 2 is formed on the buffer layer 8. The buffer layer 8 overlaps with the gate 2 in the orthographic projection direction, and the gate 2 can be firmly attached to the buffer layer 8 and is not likely to fall off.

Specifically, this step includes following steps.

At step S31', a photoresist is applied on the substrate 1 subjected to the step S2'.

At step S32', an exposure process and a development process are performed on the photoresist using a mask plate provided with the pattern of the gate 2 to form a photoresist mask 10.

At step S33', an etching process is performed on the gate film 20 to form the pattern comprising the gate 2.

At this step, a wet etching is generally used in forming the pattern comprising the gate 2 from the gate film 20, and then another etching process is performed on the buffer layer film 80 to form the pattern comprising the buffer layer 8.

At step S34', as shown in FIG. 5-4, electrical conductivity of the spacer layer film 30 in the region corresponding to the gate 2 is remained and electrical conductivity of the spacer layer film 30 in the other region is converted into electrical insulativity by an ion implantation process or a plasma treatment process, thereby forming the pattern comprising the spacer layer 3 as shown in FIG. 5-5.

Figure 56:
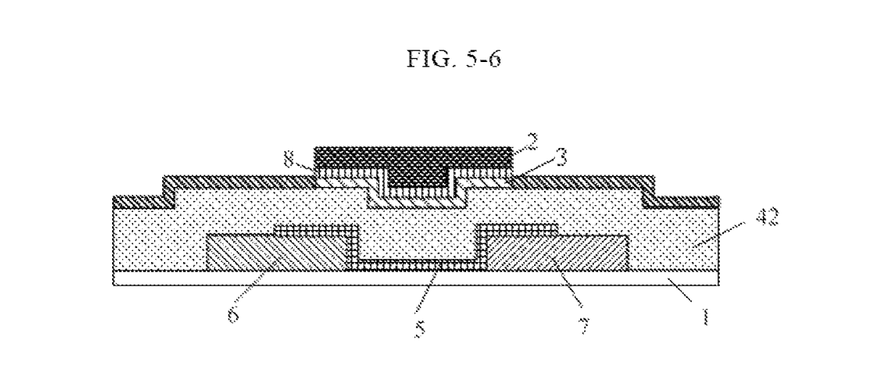

At step S35', as shown in FIG. 5-6, the photoresist mask 10 is removed by a lift-off process.

Other structures and materials of the thin film transistor in this embodiment and other steps of the method of fabricating the thin film transistor are the same as those of the first embodiment, and detailed description thereof will be omitted herein.

After above steps, fabrication of the thin film transistor of a top-gate structure is finished.

It should be appreciated that, similar to the first embodiment, in this embodiment, there is illustrated an example in which the area of the gate is smaller than that of the active layer in the thin film transistor, and the spacer layer overlaps with the gate in the orthographic projection direction.

For the case where the area of the gate is larger than that of the active layer in the top-gate thin film transistor, the spacer layer may also overlap with the active layer having a smaller area in the orthographic projection direction. In this case, the method of fabricating the thin film transistor may include following steps: forming a pattern comprising the source 6 and the drain 7 on the substrate 1; forming patterns comprising the active layer 5 and the passivation layer 42; forming a spacer layer film 30, then forming the spacer layer 3 corresponding to the pattern of the active layer by using a mask plate provided with the pattern of the active layer 5 (the spacer layer is formed in the same manner as mentioned above); and forming a pattern comprising the gate 2.

Technical effects of the first and second embodiments are as follows. In the thin film transistors according to the first and second embodiments of the present invention, the material forming the gate may be effectively prevented from being diffused into the active layer by providing the spacer layer between the gate and the active layer, thereby ensuring stability of performance of the thin film transistor, compared with the prior art in which only the insulation layer is provided between the gate and the active layer.

Third Embodiment

This embodiment provides an array substrate having a thin film transistor of a bottom-gate structure, and the array substrate includes the thin film transistor in the first embodiment.

Figure 6:
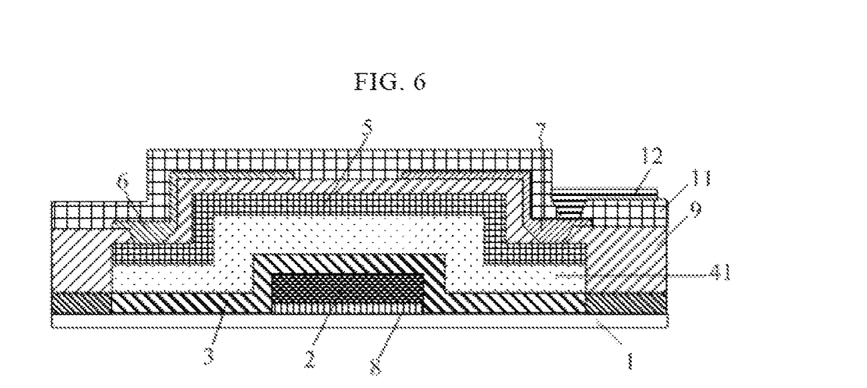
FIG. 6 is a cross-sectional view of an array substrate utilizing the thin film transistor in FIG. 2.

As shown in FIG. 6, the array substrate in the embodiment further includes a gate line and data line which intersect (not illustrated in FIG. 6), the gate line is connected to the gate 2 and is provided in the same layer as the gate 2, and the data line is connected to the source 6 and is provided in the same layer as the source 6. In the embodiment, the gate line is made of the same material as the gate 2.

The array substrate further includes a pixel electrode 12 that is connected to the drain 7. In the embodiment, a second insulation layer 11 is provided on the source 6 and the drain 7, for example, the second insulation layer 11 is a passivation layer. A via hole is provided in a region of the second insulation layer 11 corresponding to the drain 7. The pixel electrode 12 is provided on the second insulation layer 11 and is connected to the drain 7 through the via hole provided in the second insulation layer 11.

For the array substrate, the embodiment also provides a method of fabricating the array substrate. In addition to the method of fabricating the thin film transistor of a bottom-gate structure in the first embodiment, the method further includes a step of forming the gate line and the date line which intersect on the substrate, wherein the data line and the source are formed in a single patterning process, and the data line is connected to the source and is provided in the same layer as the source; the gate line and the gate are formed in a single patterning process, and the gate line is connected to the gate and is provided in the same layer as the gate.

The method further includes a step of forming the pixel electrode, and the pixel electrode is connected to the drain. In the embodiment, the second insulation layer is formed on the source and the drain; the via hole is provided in the region of the second insulation layer corresponding to the drain; the pixel electrode is formed on the second insulation layer and is connected to the drain through the via hole provided in the second insulation layer.

Other structures and materials of the array substrate in this embodiment other than those regarding the thin film transistor and steps of the method of fabricating the array substrate other than those regarding the thin film transistor are the same as in the prior art, and detailed description thereof will be omitted herein.

Fourth Embodiment

This embodiment differs from the third embodiment in that, the spacer layer further extends to a region corresponding to the gate line and overlaps at least with the gate line in the orthographic projection direction in the array substrate in present embodiment.

In the array substrate of the present embodiment, the buffer layer further extends to a region corresponding to the gate line and overlaps at least with the gate line in the orthographic projection direction. That is, the gate line is also provided on the buffer layer, and the buffer layer can make the gate line be firmly attached.

For the array substrate, the embodiment also provides a method of fabricating the array substrate. In addition to steps of the method of fabricating the thin film transistor of a bottom-gate structure in the first embodiment, the method of the present embodiment further includes steps of forming the gate line and the spacer layer corresponding to the gate line on the substrate. The gate line and the gate is formed in a single patterning process, the gate line is connected to the gate and is provided in the same layer as the gate, and the spacer layer overlaps at least with the gate line in the orthographic projection direction.

In the embodiment, in the step of forming the gate line and the data line which intersect on the substrate, the data line and the source are formed in a single patterning process, and the data line is connected to the source and is provided in the same layer as the source; the gate line and the gate are formed in a single patterning process, and the gate line is connected to the gate and is provided in the same layer as the gate; the spacer layer further extends to the region corresponding to the gate line and overlaps at least with the gate line in the orthographic projection direction. Meanwhile, in the step of forming the pattern comprising the spacer layer, electrical conductivity of the spacer layer in the region corresponding to the active layer or the gate and in the region corresponding to the gate line is remained, and electrical conductivity of the spacer layer in the other region is converted into electrical insulativity.

Other structures and materials of the array substrate in this embodiment other than those regarding the thin film transistor and other steps of the method of fabricating the array substrate other than those regarding the thin film transistor are the same as in the third embodiment, and detailed description thereof will be omitted herein.

Fifth Embodiment

This embodiment provides an array substrate having a thin film transistor of a top-gate structure, and the array substrate includes the thin film transistor in the second embodiment.

Figure 7:
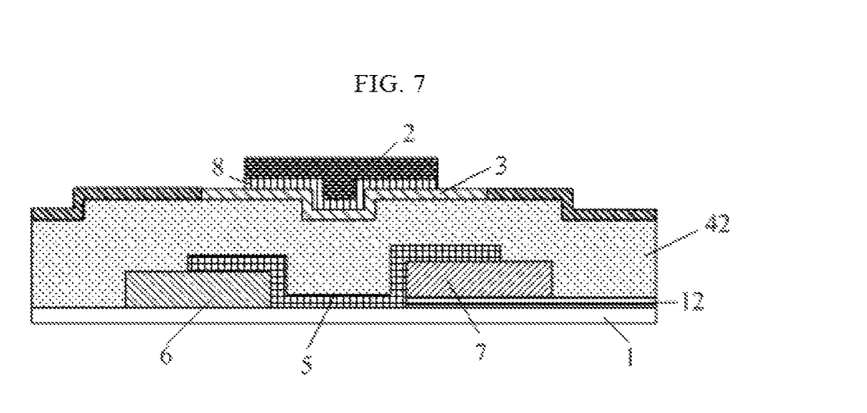
FIG. 7 is a cross-sectional view of an array substrate utilizing the thin film transistor in FIG. 4.

As shown in FIG. 7, different from the third embodiment, in the array substrate in this embodiment, the pixel electrode 12 is provided on the surface of the substrate 1 and below the drain 7, the pixel electrode 12 overlaps with the drain 7 and is connected to the drain 7.

For the array substrate, the embodiment also provides a method of fabricating the array substrate, including the method of fabricating the thin film transistor of a top-gate structure in the second embodiment. Different from the method of fabricating the array substrate in the third embodiment, the pixel electrode is formed on the surface of the substrate and below the drain.

Other structures and materials of the array substrate in this embodiment other than those regarding the thin film transistor and other steps of the method of fabricating the array substrate other than those regarding the thin film transistor are the same as in the third embodiment, and detailed description thereof will be omitted herein.

Sixth Embodiment

This embodiment differs from the fifth embodiment in that, the spacer layer further extends to a region corresponding to the gate line and overlaps at least with the gate line in the orthographic projection direction in the array substrate in present embodiment.

In the array substrate of the present embodiment, the buffer layer further extends to a region corresponding to the gate line and overlaps at least with the gate line in the orthographic projection direction.

In the method of fabricating the array substrate in the embodiment, in a step of forming the pattern comprising the spacer layer, electrical conductivity of the spacer layer in the region corresponding to the active layer or the gate and in the region corresponding to the gate line is remained, and electrical conductivity of the spacer layer in the other region is converted into electrical insulativity.

Other structures and materials of the array substrate in this embodiment other than those regarding the thin film transistor and other steps of the method of fabricating the array substrate other than those regarding the thin film transistor are the same as the fourth embodiment, and detailed description thereof will be omitted herein.

Technical effects of the third through the sixth embodiments are as follows. In the array substrates according to the third through the six embodiments, the spacer layer can prevent the material forming the gate (e.g., copper ion or aluminum ion) from being diffused into the active layer in the thin film transistor, and further prevents the material forming the gate line (e.g., copper ion or aluminum ion) from being diffused into the active layer, thereby ensuring stability of performance of the array substrate.

Seventh Embodiment

This embodiment provides a display device including the array substrate according to any one of the third through the six embodiments.

The display device may be a liquid crystal display device or an electroluminescent display device, such as a liquid crystal panel, a liquid crystal television, a cell phone, a liquid crystal display.

In the display device, stability of performance of the display device is ensured by utilizing the array substrate provided with the spacer layer.

It should be appreciated that the above embodiments are only the exemplary embodiments employed for illustrating the principle of the present invention, but the present invention is not limited thereto. It will be apparent to those skilled in the art that modifications and variations can be made without departing from the spirit and scope of the present invention, and these modifications and variations are also considered to fall within the scope of protection of the present invention.

The invention claimed is:

1. A thin film transistor, including a substrate and a gate, an insulation layer, an active layer, a source and a drain which are provided on the substrate, the insulation layer being provided between the gate and the active layer, wherein a spacer layer is also provided between the gate and the active layer, and a blocking capability of the spacer layer with respect to diffusion of a material forming the gate is stronger than a blocking capability of the insulation layer with respect to the diffusion of the material forming the gate, wherein the spacer layer is made of nano silver.

2. The thin film transistor of claim 1, wherein the spacer layer overlaps at least with one of the gate and the active layer having a smaller area in an orthographic projection direction.

3. The thin film transistor of claim 1, wherein the spacer layer is closer to the gate than the insulation layer, and the insulation layer is provided between the spacer layer and the active layer.

4. The thin film transistor of claim 3, wherein the source and the drain are provided at two ends of the active layer, and partially overlap with the gate in the orthographic projection direction, respectively.

5. The thin film transistor of claim 4, wherein the insulation layer is a gate insulation layer, and the thin film transistor further includes an etch stop layer, and wherein the gate is provided on the substrate; the spacer layer, the gate insulation layer and the active layer are provided sequentially on the gate, the etch stop layer is provided on the active layer; via holes are provided in the etch stop layer corresponding to the two ends of the active layer, and the source and the drain are connected to the active layer through the via holes, respectively.

6. The thin film transistor of claim 4, wherein the insulation layer is a passivation layer, and wherein the source and the drain are provided on the substrate to be separated from each other; the active layer is provided between the source and the drain and extends above the source and the drain, respectively, so as to contact a part of side walls and a part of upper surfaces of the source and the drain; the passivation layer and the spacer layer are sequentially provided on the active layer; and the gate is provided on the spacer layer.

7. The thin film transistor of claim 1, wherein the spacer layer is made from metal or metal oxide having a characteristic of transition from electrical conductivity to electrical insulativity, the gate is made from copper or aluminum, and the active layer is made from metal oxide.

8. The thin film transistor of claim 2, wherein the spacer layer is made from metal or metal oxide having a characteristic of transition from electrical conductivity to electrical insulativity, the gate is made from copper or aluminum, and the active layer is made from metal oxide.

9. The thin film transistor of claim 3, wherein the spacer layer is made from metal or metal oxide having a characteristic of transition from electrical conductivity to electrical insulativity, the gate is made from copper or aluminum, and the active layer is made from metal oxide.

10. The thin film transistor of claim 4, wherein the spacer layer is made from metal or metal oxide having a characteristic of transition from electrical conductivity to electrical insulativity, the gate is made from copper or aluminum, and the active layer is made from metal oxide.

11. The thin film transistor of claim 5, wherein the spacer layer is made from metal or metal oxide having a characteristic of transition from electrical conductivity to electrical insulativity, the gate is made from copper or aluminum, and the active layer is made from metal oxide.

12. The thin film transistor of claim 6, wherein the spacer layer is made from metal or metal oxide having a characteristic of transition from electrical conductivity to electrical insulativity, the gate is made from copper or aluminum, and the active layer is made from metal oxide.

13. An array substrate, including a thin film transistor comprising a substrate and a gate, an insulation layer, an active layer, a source and a drain which are provided on the substrate, the insulation layer being provided between the gate and the active layer, wherein a spacer layer is also provided between the gate and the active layer, and a blocking capability of the spacer layer with respect to diffusion of a material forming the gate is stronger than a blocking capability of the insulation layer with respect to the diffusion of the material forming the gate, wherein the spacer layer is made of nano silver.

14. The array substrate of claim 13, wherein the spacer layer overlaps at least with one of the gate and the active layer having a smaller area in an orthographic projection direction.

15. The array substrate of claim 13, wherein the spacer layer is closer to the gate than the insulation layer, and the insulation layer is provided between the spacer layer and the active layer.

16. The array substrate of claim 13, wherein the spacer layer is made from metal or metal oxide having a characteristic of transition from electrical conductivity to electrical insulativity, the gate is made from copper or aluminum, and the active layer is made from metal oxide.

17. The array substrate of claim 13, further including a gate line, wherein the gate line is made from the same material as the gate, the gate line is connected to the gate and is provided in the same layer as the gate; the spacer layer further extends to a region corresponding to the gate line and overlaps at least with the gate line in the orthographic projection direction.

18. A display device, including an array substrate, the array substrate including a thin film transistor comprising a substrate and a gate, an insulation layer, an active layer, a source and a drain which are provided on the substrate, the insulation layer being provided between the gate and the active layer, wherein a spacer layer is also provided between the gate and the active layer, and a blocking capability of the spacer layer with respect to diffusion of a material forming the gate is stronger than a blocking capability of the insulation layer with respect to the diffusion of the material forming the gate, wherein the spacer layer is made of nano silver.

* * * * *